United States Patent [19]
Osaki et al.

[11] Patent Number: 5,614,860
[45] Date of Patent: Mar. 25, 1997

[54] VOLTAGE-CONTROLLED FILTER CIRCUIT, A SEMICONDUCTOR INTEGRATED CIRCUIT DEVICE FOR SIGNAL PROCESSING, AND A SIGNAL READING APPARATUS USING THE CIRCUIT AND THE APPARATUS

[75] Inventors: Katsumi Osaki; Takashi Nara; Hitoshi Watanabe, all of Takasaki, Japan

[73] Assignees: Hitachi, Ltd., Tokyo; Akita Electronics Co., Ltd., Akita, both of Japan

[21] Appl. No.: 427,858

[22] Filed: Apr. 26, 1995

[30] Foreign Application Priority Data

May 12, 1994 [JP] Japan ................................. 6-123006
Apr. 18, 1995 [JP] Japan ................................. 7-115332

[51] Int. Cl.$^6$ ................................................. H03B 1/00
[52] U.S. Cl. ........................ 327/552; 327/553; 327/563; 330/252
[58] Field of Search ................................. 327/551, 552, 327/553, 560, 563, 544; 330/252, 254

[56] References Cited

U.S. PATENT DOCUMENTS

| | | | |
|---|---|---|---|
| 4,306,198 | 12/1981 | Okada | 330/260 |
| 4,404,529 | 9/1983 | Rossum et al. | 330/303 |
| 4,528,515 | 7/1985 | Gross | 330/254 |
| 5,182,477 | 1/1993 | Yamasaki et al. | 327/65 |
| 5,250,917 | 10/1993 | Honda et al. | 333/214 |
| 5,396,188 | 3/1995 | Aoki | 327/552 |
| 5,418,494 | 5/1995 | Betti et al. | 330/254 |
| 5,463,349 | 10/1995 | Petersen et al. | 330/254 |

OTHER PUBLICATIONS

Anarogu IC no Kino Kairo Sekkei Nyumon, CQ Publishing Co., LTD, 2992, "Primer of Designing Functional Circuits for Analog ICs".

*Primary Examiner*—Timothy P. Callahan
*Assistant Examiner*—Kenneth B. Wells
*Attorney, Agent, or Firm*—Fay, Sharpe, Beall, Fagan, Minnich & McKee

[57] ABSTRACT

A voltage-controlled filter circuit has a cutoff frequency directly proportional to a ratio of two current values. The filter circuit comprises a variable conductance circuit having two bipolar junction input transistors supplied with an input voltage signal at the bases thereof and a first variable current source at each emitter thereof. The collectors supply the bases of a pair of differential transistors. A second variable current supply is coupled to common emitters of the pair of differential transistors. Externally supplied control signals set the two current values of the variable current sources. The filter circuit may be manufactured as a semiconductor integrated circuit device for signal processing for use in processing a recorded signal read from a recording medium. The recorded signal is supplied to a semiconductor integrated circuit for signal processing to remove unwanted signal and noise components. Specific unwanted signal components may be removed and noise components whose frequencies exceed a cutoff frequency of a low-pass filter provided in a semiconductor integrated circuit are removed.

8 Claims, 8 Drawing Sheets

VOLTAGE-CONTROLLED FILTER CIRCUIT, A SEMICONDUCTOR INTEGRATED CIRCUIT DEVICE FOR SIGNAL PROCESSING, AND A SIGNAL READING APPARATUS USING THE CIRCUIT AND THE APPARATUS

BACKGROUND OF THE INVENTION

The present invention relates to a voltage-controlled filter such as an active filter circuit and, more particularly, to a technology effectively used for an active filter circuit utilizing the mutual conductance of a differential amplifier. Further, the present invention relates to a semiconductor integrated circuit device for signal processing for use in processing a recording signal read from a recording medium (or a magnetic disk) for example and to a technology effectively applied to a disk reading system such as a hard disk drive (or a hard disk memory) utilizing the above-mentioned semiconductor integrated circuit.

Disk reading systems such as a hard disk drive (hereinafter referred to also as a hard disk memory device or an HDD), a floppy disk drive (hereinafter referred to also as an FDD), a CDROM (Compact Disk Read-Only Memory) drive, and an MO (Magneto-Optical) disk drive are used as external storage devices for data processors such as a small workstation and a personal computer. The hard disk drive or a floppy disk drive uses a magnetic disk (or a magnetic recording medium) for information recording medium. The CDROM drive uses an optical disk on which information is stored optically. The MO drive uses an optical disk on which information can be rewritten.

In the hard disk drive or the floppy disk drive, data is written through a magnetic head to a track on the magnetic disk rotated by a spindle motor or read from a track through the magnetic head. A recorded signal read through the magnetic head from the magnetic disk is supplied to a semiconductor integrated circuit for signal processing contained in an external storage device to be removed of an unwanted signal component and a noise component for example. The removal is aimed at those unwanted signal component and noise component whose frequencies exceed a cutoff frequency of a low-pass filter provided in a semiconductor integrated circuit for read channel.

To cope with the ever-increasing processing speed of data processors and the ever-increasing scale of application software, attempts are being made to increase the data recording density (or the surface recording density) of disks and the data transfer rates of hard disk drives, floppy disk drives, CDROM drives, and MO drives.

For a technique to increase the recording density, multi-zone recording is known. In the multi-zone recording, the frequency of a signal to be recorded on a track on the outer periphery side is made relatively greater than the frequency of a signal to be recorded on track on the inner periphery side with the rotational speed (or the angular velocity) of the magnetic disk kept constant. This increases the recording density of the tracks on the outer periphery side, thereby increasing the recording density of the magnetic disk in its entirety. As a result, in the multi-zone recording, the recording density is uniform over all the tracks on the magnetic disk.

Consequently, when reading the data recorded on the magnetic disk by the multi-zone recording, the above-mentioned semiconductor integrated circuit device for signal processing handles the read signal whose frequency changes from low to high. That is, the cutoff frequency of the low-pass filter provided in the semiconductor integrated circuit device is variably controlled according to the frequency of the signal read from the magnetic disk. In other words, when reading the signal from a track on the inner periphery side of the magnetic disk, the cutoff frequency of the low-pass filter is made relatively low, while, when reading the signal from a track on the outer periphery side, the cutoff frequency is made relatively high.

For the low-pass filter provided in the above-mentioned signal-processing semiconductor integrated circuit device, an active filter circuit (or a voltage-controlled filter) utilizing the mutual conductance gm of a differential amplifier is available. For example, such an active filter circuit is described in "Introduction to Analog IC Functional Circuit Design," CQ Publishing Company, p. 151. The active filter circuit comprises a variable conductance circuit having a pair of input transistors whose bases are supplied with an input voltage signal and emitters each provided with a constant current source, a load means commonly attached to the pair of transistors at their collectors via unidirectional devices, a pair of differential transistors whose bases are supplied respectively with the outputs of the collectors of the pair of input transistors, a variable current supply attached to the common emitters of the pair of differential transistors, and current source loads attached respectively to the collectors of the pair of differential transistors so that a half of the current value of the variable current source flows through each of the load, the above-mentioned variable conductance circuit being combined with capacitors. In the active filter circuit thus constituted, the mutual conductance gm of the differential amplifier composed of the pair of differential transistors, current source loads, and the variable current source can be varied by varying, as desired, a value of the current flowing to the pair of differential transistors. Thus, constituting a low-pass filter by using the above-mentioned active filter allows to obtain a desired cutoff frequency.

SUMMARY OF THE INVENTION

It has been found that when using the active filter as the low-pass filter for the signal-processing semiconductor integrated circuit, it may handle the signal whose frequency varies in a wide range. Furthermore, it may handle varying the value of the current flowing to the differential amplifier in the low-pass filter for varying the mutual conductance of the differential amplifier to vary the cutoff frequency of the low-pass filter. However this significantly increases the current consumption of the signal-processing semiconductor integrated circuit, especially, the power consumption of the low-pass filter. That is, the cutoff frequency (fc) of the low-pass filter composed of the active filter is proportional to the ratio (I1/I0) of a value (I0) of the constant current sources coupled to the pair of input transistors to a value (I1) of the variable current source.

Consequently, when varying the cutoff frequency (fc) from 3 MHz to 27 MHz for example, the value of the variable current source (I1) at 27 MHz becomes nine times as large as that at 3 MHz.

As a result, a semiconductor chip (or a semiconductor substrate) formed with the above-mentioned signal-processing semiconductor integrated circuit cannot be sealed with low-cost resin; instead, the chip needs to be sealed with costly ceramic, thereby making costly the signal-processing semiconductor integrated circuit.

Even if the signal-processing semiconductor integrated circuit is designed with the above-mentioned active filter so that the signals read from the tracks extending from the inner periphery to the outer periphery of the disk can be covered, it is still necessary to design generally as many types of signal processing semiconductor integrated circuits as there are hard disk memory devices corresponding to a variety of frequencies to be handled by particular systems. Namely, since magnetic disk diameters and disk rotational speeds vary with system manufactures and/or systems, the frequencies of the signals to be handled by the signal-processing semiconductor integrated circuit are diversified. This makes it inevitable for the signal-processing semiconductor integrated circuit to be manufactured on a many-types, small-lot basis, thereby making the circuit disadvantageous in terms of cost.

To solve one or more of the above-mentioned problems, we have invented a voltage-controlled filter circuit that consumes relatively less power and provides desired cutoff frequencies in a relatively wider range.

It is therefore an object of the present invention to provide a voltage-controlled filter circuit that consumes relatively less power and provides desired cutoff frequencies in a relatively wider range.

It is another object of the present invention to provide a signal-processing semiconductor integrated circuit device including a low-cost voltage-controlled filter circuit.

It is still another object of the present invention to provide a signal-processing semiconductor integrated circuit device including a highly general-purpose voltage-controlled filter circuit.

It is yet another object of the present invention to provide a low-cost and highly general purpose signal-processing semiconductor integrated circuit device and a disk drive system using this device.

These and other objects, features and advantages of the invention will be readily appreciated as the same becomes better understood by reference to the following detailed description when considered in connection with the accompanying drawing.

In what follows, some representative features of the invention disclosed herein will be briefly summarized.

In carrying out the invention and according to one aspect thereof, there is provided a voltage-controlled filter circuit (or an active filter) comprising: a variable conductance circuit having; a pair of input transistors supplied with an input voltage signal at bases thereof and a first variable current source at each of emitters thereof; load means commonly coupled to the pair of input transistors at collectors thereof via unidirectional devices; a pair of differential transistors supplied at bases thereof respectively with outputs of the collectors of the pair of input transistors; a second variable current supply coupled to common emitters of the pair of differential transistors; and a current source load coupled respectively to collectors of the pair of differential transistors so that a half of a current value of the second variable current source flows; wherein a current value of the first current source is switched to become smaller as predetermined frequency ranges get higher. While, the current value of the second variable current source is variably controlled so that a ratio ($I1/I0$) of the current value ($I0$) of the first variable current source to the current value ($I1$) of the second variable current source provides a desired cutoff frequency ($fc$).

Namely, as described above, the cutoff frequency ($fc$) of the low-pass filter implemented by the active filter is proportional to the ratio ($I1/I0$) of the current value ($I0$) of the first variable current source coupled to the pair of input transistors to the current value ($I1$) of the second variable current source coupled to the pair of differential transistors. Therefore, suppose that the cutoff frequency ($fc$) is varied from 3 MHz to 27 MHz for example. The current value of the first variable current source when the cutoff frequency ($fc$) is from 9 MHz to 27 MHz is one third ($I0/3$) of the current value ($I0$) of the first variable current source when the cutoff frequency ($fc$) is from 3 MHz to 9 MHz. Given the cutoff frequency ($fc$) at 3 MHz being one, then the current value ($I1$) of the second variable current source changes at most three times as high as the value at 3 MHz. As a result, the current value of the second variable current source, which affects filter power consumption, is significantly reduced.

When the low-pass filter using the above-mentioned voltage-controlled filter circuit is provided in the signal-processing semiconductor integrated circuit device, each of the current value ($I0$) of the first variable current source and the current value ($I1$) of the second variable current source is formed by selecting a desired number of reference current sources from a plurality of reference current sources in order to change the current value ($I0$) of the first variable current source and the current value ($I1$) of the second variable current source. For this reference current source selection, a plurality of registers are provided in the signal-processing semiconductor integrated circuit device, the registers capable of being written from outside this circuit device. The plurality of registers include a first register capable of being written with a frequency variation of a signal to be handled by the signal-processing semiconductor integrated circuit device, or first data associated with a necessary cutoff frequency variation of the low-pass filter, and a second register dynamically written with second data from a microcomputer for example, the second data being associated with the setting of the cutoff frequency of the low-pass filter to make adaptation to a track from which data is read. Additionally, the signal-processing semiconductor integrated circuit device is provided with a selector circuit for selecting the desired number of reference current sources or a predetermined number of reference current sources from among the above-mentioned plurality of reference current sources on the basis of the first and second data written to the first and second registers respectively.

The above-mentioned novel setup provides the following advantages.

The current value of the first variable current source is selected so that the current value decreases in steps as the frequency range gets higher and the current value of the second variable current source is variably controlled so that the ratio ($I1/I0$) of the current value ($I0$) of the first variable current source to the current value ($I1$) of the second variable current source provides a desired cutoff frequency ($fc$). Consequently, the variation of the variable second current source, which affects the power consumption of the voltage-controlled filter circuit is reduced, thereby saving the power consumption of the voltage-controlled filter circuit significantly.

Since the use of the voltage-controlled filter circuit according to the present invention for the low-pass filter of the signal-processing semiconductor integrated circuit device saves the power consumption of the voltage-controlled filter circuit, the power consumption of the signal-processing semiconductor integrated circuit device is also reduced. As a result, a semiconductor chip (or a semiconductor substrate) on which the signal-processing semiconductor integrated circuit device is formed can be sealed with low-cost resin, thereby reducing the cost of the IC device.

In the signal-processing integrated circuit device using the voltage-controlled filter circuit according to the invention, combinations of reference current sources that forms the current value (I0) of the first variable current source and the current value (I1) of the second variable current source are determined on the basis of the data associated with the variation of the cutoff frequency written to the first register. Then, based on the data written to the second register, an optimum combination is selected by the selector circuit from among the above-mentioned combinations determined by the first data. Since the contents of the first register are changeably constituted, a variety of cutoff frequency ranges may be set on a single signal-processing semiconductor integrated circuit device. As a result, the generality of the signal-processing semiconductor integrated circuit device is enhanced. On the other hand, since the currently used cutoff frequency is dynamically written to the second register and the optimum combination of reference current sources to be used based on the written cutoff frequency is selected, the signal-processing semiconductor integrated circuit device of low power consumption and high generality is provided.

Further, serial data transfer is used for writing data to the first and second registers, so that the number of external pins provided on the signal-processing semiconductor integrated circuit device is reduced, resulting in a relatively smaller area of the semiconductor substrate on which the IC device is formed. Consequently, the plastic (or resin) sealed signal-processing semiconductor integrated circuit device of low power consumption and high generality and having the relatively smaller number of external pins.

BRIEF DISCLOSURE OF THE DRAWINGS

DETAILED DESCRIPTION OF PREFERRED EMBODIMENTS

This invention will be described in further detail by way of example with reference to the accompanying drawings.

Figure 7:
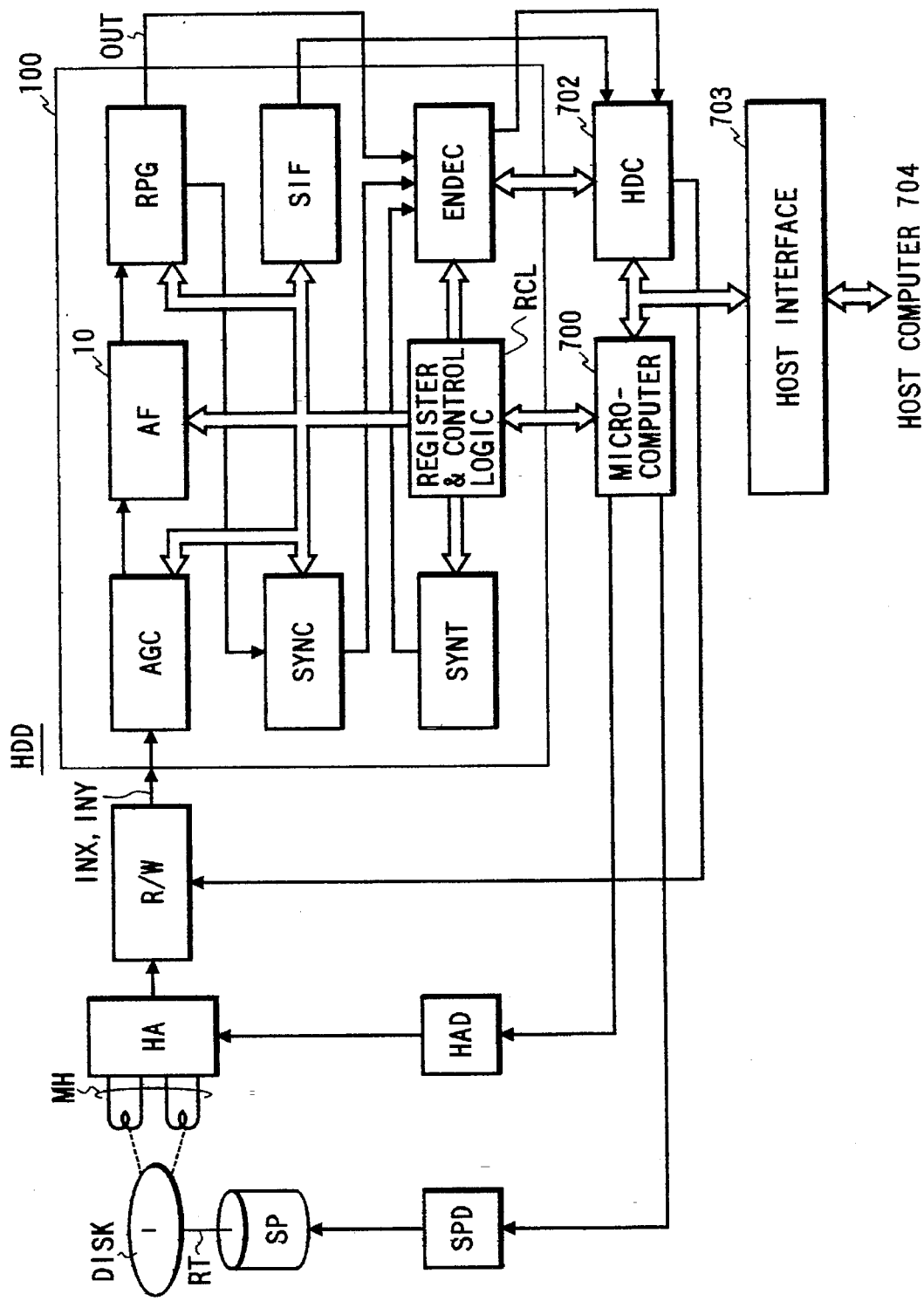
FIG. 7 is a system block diagram illustrating a hard disk that uses an active filter associated with the invention.

Now, referring to FIG. 7, a disk reading system using a signal-processing semiconductor integrated circuit device 100 according to the present invention is described.

The disk reading system of FIG. 7 is a hard disk device (HDD) for reading data stored on a magnetic disk (DISK) providing information to the recording medium.

The HDD includes a magnetic head (MH) for reading data from the magnetic disk (or the hard disk) or writing data thereto, a head actuator (HA) for positioning the magnetic head to a desired track on the magnetic disk, and a read/write amplifier (R/W AMP) for amplifying a signal read from the magnetic head and entering the amplified signal in the signal-processing semiconductor integrated circuit device (or the data channel processor) 100 according to the present invention. The magnetic disk is mounted on a rotor (RT) of a spindle motor (SP). The spindle motor is driven by a spindle motor driver (SPD) at a constant rotational speed (or a constant angular velocity) under control of a microcomputer 700 when data is read from or written to the magnetic disk. The head actuator is controlled by a head actuator driver HAD controlled by the microcomputer 700 to position the magnetic head to a track on the magnetic disk to be read. The microcomputer 700 is supplied, from a hard disk controller HDC 702, with track address information associated with a track on the magnetic disk to be read, based on which the microcomputer controls the head actuator driver.

Signals INX and INY output from the read/write amplifier are supplied to an automatic gain control amplifier AGC provided in the signal-processing semiconductor integrated circuit device (or the data channel processor). An output signal of the automatic gain control amplifier is supplied to an active filter 10 serving as a voltage-controlled filter associated with the present invention. The active filter 10 removes, from the output signal of the automatic gain control amplifier, an unwanted signal or noise that exceeds a cutoff frequency set to the active filter 10. A resulting read signal is sent to a read pulse generator (RPG). A digital output signal (OUT) of the read pulse generator is code-converted by an encoder/decoder (ENDEC) to be supplied to a host computer 704 via the hard disk controller 702 and a host interface 703.

Figure 8:
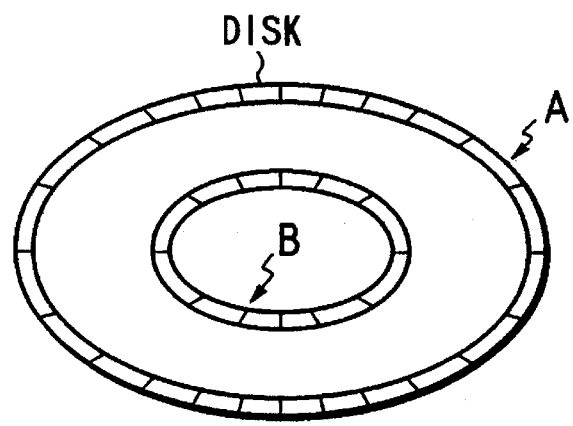
FIG. 8 is a schematic diagram illustrating magnetic disk recording scheme used for the hard disk system according to the invention.

As shown in FIG. 8, the above-mentioned hard disk stores data recorded in multi-zone recording. In multi-zone recording, a frequency of a track on the outer periphery side of the magnetic disk is made relatively higher than a frequency of a track on the inner periphery side with the rotational speed (or angular velocity) of the magnetic disk kept constant. Thus, the recording density of the tracks on the magnetic disk between the innermost track (B) and the outermost track are all made equal, and a data transfer rate of the magnetic disk gets gradually faster from the innermost track toward the outermost track.

Figure 1:
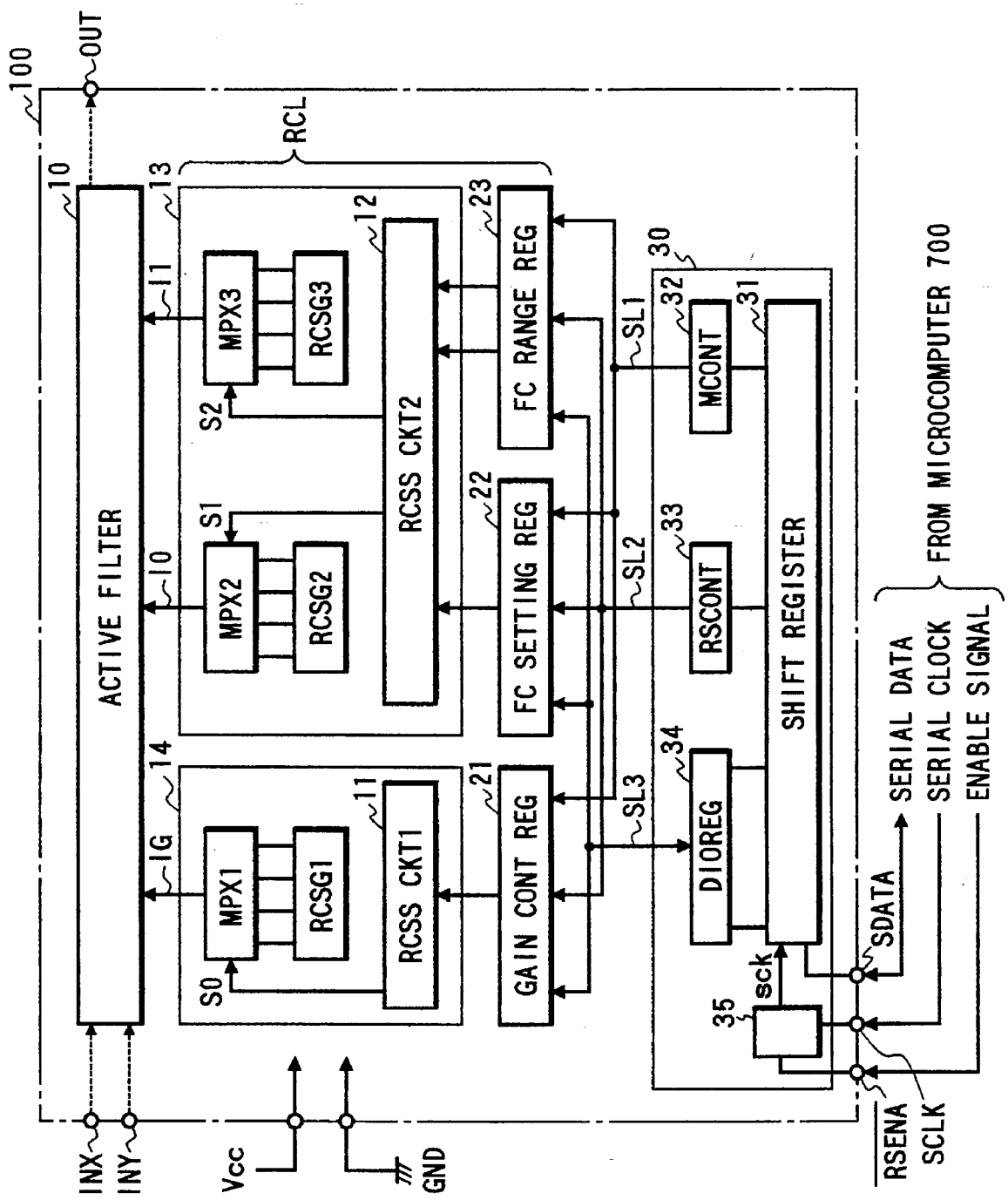
FIG. 1 is a block diagram illustrating an active filter circuit practiced as one preferred embodiment of the invention.

Consequently, a frequency of the read signal entered from the automatic gain control amplifier into the active filter 10 gets higher as the read operation proceeds from an inner track to an outer track. For this reason, the cutoff frequency of the active filter 10 is set by a register and control logic (RCL) in correspondence to track addresses of tracks to be read. The cutoff frequency is controlled by the microcomputer 700. The microcomputer 700 determines a track address of a read track supplied from the hard disk controller HDC 702 to write a desired value of the cutoff frequency necessary for reading data from the read track, to a cutoff frequency setting register 22 in FIG. 1 provided in the register and control logic. When the desired value is written, the cutoff frequency of the active filter 10 is set to the cutoff frequency necessary for reading the data from the read track.

Referring to FIG. 7, thick arrowhead lines indicate a control bus, over which the setting of desired cutoff frequencies is performed by the register and control logic. It should be noted that a synchronizer (SYNC) for generating an encode clock for writing data, a synthesizer SYNT for generating a decode clock for reading data, a servo interface (SIF) for servo controlling the head actuator, and the encoder/decoder for encoding write data and decoding read data are included in the signal-processing semiconductor integrated circuit device; however, the description of these components will not be made because they are not directly associated with the present invention. Also, in FIG. 7, some signal lines and control lines for writing data are omitted for convenience of illustration.

Referring to FIG. 1, there is shown a block diagram illustrating one preferred embodiment of the signal-processing semiconductor integrated circuit device 100 including the active filter 10 serving as the voltage-controlled filter circuit to which the present invention is applied. In the figure, the active filter 10 is formed on a semiconductor substrate (or semiconductor chip) such as a single crystal silicon indicated with a single dot & dash line by means of a known semiconductor integrated circuit manufacturing technique. In the figure, the signal-processing semiconductor integrated circuit device 100 is used for the disk reading system, but not limited thereto, such as the hard disk device described with reference to FIG. 7. It should be noted that a circle on the single dot & dash line indicates an external pin of the circuit device 100. Signal input pins INX and INY provide external pins for receiving an output signal from the read/write amplifier R/W of FIG. 7. A signal output pin OUT provides an external pin for receiving an output signal from the read pulse generator RPG of FIG. 7. External pins Vcc and GND are pins to which a power potential and a ground potential for the circuit device 100 are supplied respectively. It should be noted that the automatic gain control amplifier AGC and the read pulse generator RPG are not illustrated in FIG. 1.

The seventh-order active filter 10 of FIG. 1 receives an input signal from the signal input pins INX and INY, filters the received input signal, and outputs the filtered signal to the output pin OUT as an output signal.

The seventh-order active filter is controlled in its gain by a gain control current IG and in its cutoff frequency (fc) by a first current I0 and a second current I1. These currents IG, I0 and I1 are set by multiplexing currents of n reference current source groups RCSG1, RCSG2 and RCSG3 by multiplexers MPX1, MPX2 and MPX3 respectively. The n current source groups RCSG1, RCSG2 and RCSG3 are set up so that only a reference current source necessary for minimizing the power consumption of the active filter circuit 10 flows a reference current. This is controlled by a reference current source select logic circuits (RCSS CKT1) 11 and (RCSS CKT2) 12. The reference current source select logic circuits 11 and 12 form select signals S0, S1 and S2 for controlling the multiplexers MPX1, MPX2 and MPX3 respectively, based on data set to a gain control register (Gain cont REG) 21, an fc setting register (fc Setting REG) 22 and an fc range register (fc Range REG) 23. An operating voltage (Vcc) for the reference current sources not selected by the reference current source select logic circuits 11 and 12 is turned off.

Consequently, as shown in FIG. 1, the signal-processing semiconductor integrated circuit device 100 includes a cutoff frequency control circuit 13 for controlling the cutoff frequency of the seventh-order active filter 10 and a gain control circuit 14 for controlling the gain of the filter 10. The register and control logic RCL of FIG. 7 comprises the cutoff frequency control circuit 13, the gain control circuit 14, the gain control register 21, the fc setting register 22, and the fc range register 23.

A system control apparatus such as the microcomputer 700 of FIG. 7 puts cutoff frequency setting data for the seventh-order active filter 10 into the gain control register 21, the fc setting register 22, and the fc range register 23. However, the above-mentioned data is dynamically set to the fc setting register 22 when a track address of a read track on the magnetic disk is supplied from the hard disk controller HDC to the microcomputer 700. On the other hand, the data is set to the gain control register 21 and the fc range register 23 by the microcomputer 700 based on a hard disk activating program for example when the hard disk HDD is supplied with power to be put in an activated state.

The data is set to the gain control register 21, the fc setting register 22, and the fc range register 23 by a data setting circuit 30. The data setting circuit 30 receives serial data, a serial clock and a register select enable signal via external pins SDATA, SCLK and /RSENA respectively. The data setting circuit 30 includes a shift register 31, a mode control circuit (Mcont) 32, a register select control circuit (RScont) 33, a data input/output register (DIOREG) 34, and a clock control circuit 35 for controlling the supply of the serial clock sck to the shift register 31 based on the register select enable signal.

Figure 11:
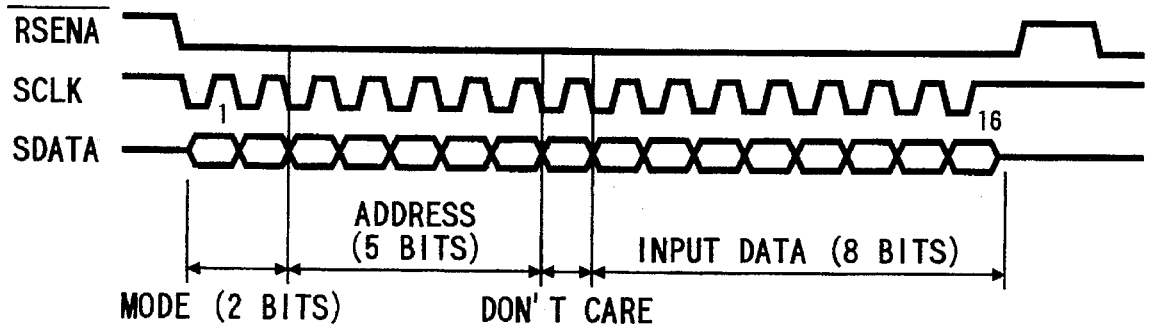
FIG. 11 is a timing chart illustrating a data write operation.
Figure 12:
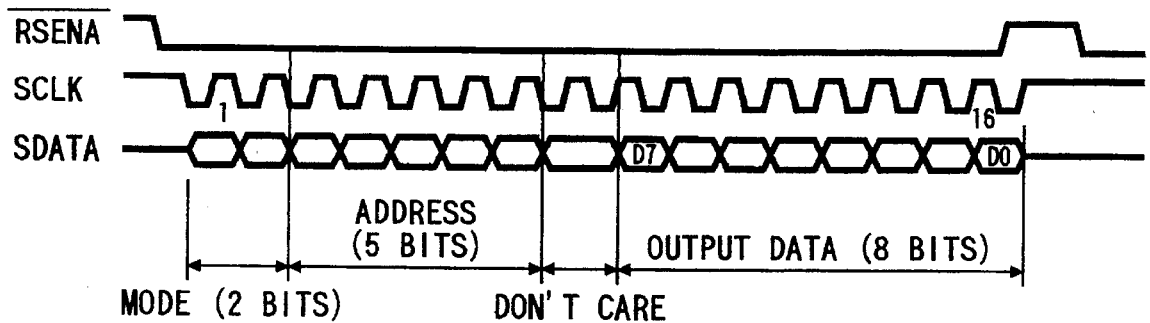
FIG. 12 is a timing chart illustrating a data read operation.

The mode control circuit 32 receives mode data indicating a 2-bit read mode or a 2-bit write mode to supply a mode control signal to the gain control register 21, the fc setting register 22 and the fc range register 23 via a signal line (control bus) SL1. The register select control circuit 33 receives 5-bit address data from the shift register 31 to supply a select control signal to one of the gain control register 21, the fc setting register 22 and the fc range register 23 via a select signal line (address select line) SL2. The data input/output register 34 receives 8-bit data from the shift register 31 when the mode data indicates the write mode, supplying the 8-bit data to a register selected by the register select control circuit 33 via a data signal line (data bus) SL3. On the other hand, the data input/output register 34 receives the 8-bit data from a register selected by the register select control circuit 33 when the mode data indicates the read mode via the data signal line SL3 and passes the 8-bit data to the shift register 31. FIGS. 11 and 12 are timing charts indicating the timings of data read/write operations with the gain control register 21, the fc setting register 22 and the fc range register 23. As seen from the figures, when the register select enable signal goes low, the clock control circuit 35 is activated. Because FIGS. 11 and 12 are easily understood, their detail descriptions are omitted. Thus, the data is set to the registers 21, 22 and 23 by means of serial transmission, thereby reducing the number of external pins required for the setting.

In the seventh-order active filter 10 of the present embodiment, a range of a cutoff frequency required by the signal-processing semiconductor integrated circuit device 100 using the seventh-order active filter 10 is determined by the data (first data) written to the fc range register 13 in order to set a given cutoff frequency at a relatively low power consumption in a wide range. The cutoff frequency range is divided into a plurality of divisions of frequency setting ranges to obtain desired low power consumption. When reading data stored on a desired track on the magnetic disk through the magnetic head, the microcomputer 700 of FIG. 7 receives address data associated with a track address of a track to be read from the hard disk controller 702 and, based on the received address data, writes cutoff frequency data (second data) associated with a cutoff frequency required to read data from the track to the fc setting register 22. Based on the data written to the fc setting register 22, the reference current source select circuit RCSS CKT2 interprets a specified cutoff frequency to determine the above-mentioned variable current I0 according to a frequency division containing the specified cutoff frequency and determine the above-mentioned variable current I1 according to the variable current I0.

The above-mentioned seventh-order active filter 10 comprises a second-order low-pass filter LPF1, a second-order high-pass filter HPF1, a boost amplifier −K, a second-order low-pass filter LPF2, a second-order low-pass filter LPF3, a first-order low-pass filter LPF4, and a first-order high-pass filter HPF2 to be described with reference to FIG. 6.

Figure 2:
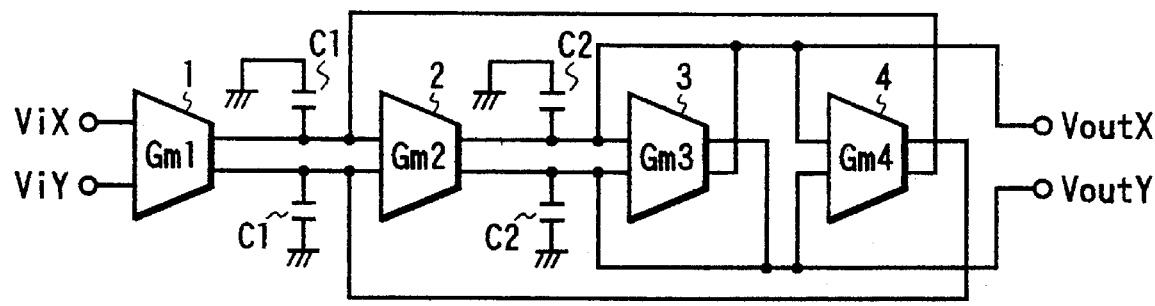
FIG. 2 is a block diagram illustrating a secondary low-pass filter of FIG. 1 practiced as one preferred embodiment of the invention.

Referring to FIG. 2, there is shown a block diagram of the above-mentioned low-pass filter LPF2 practiced as one preferred embodiment of the invention. The low-pass filter LPF2 consists of a second-order biquad circuit. Input signals ViX and ViY are supplied to a differential amplifier (Gm1) 1 of which mutual conductance gm1 and capacitors C1 provided on its output constitute a first-order low-pass filter. An output signal of this low-pass filter is supplied to another low-pass filter composed of mutual conductance gm2 consisting of a differential amplifier (GM2) 2 and capacitors C2, totally providing the second-order low-pass filter. An output signal of the differential amplifier 2 is fed back by a differential amplifier (Gm3) 3 and a differential amplifier (Gm4) 4 to form output signals VoutX and VoutY.

Figure 3:
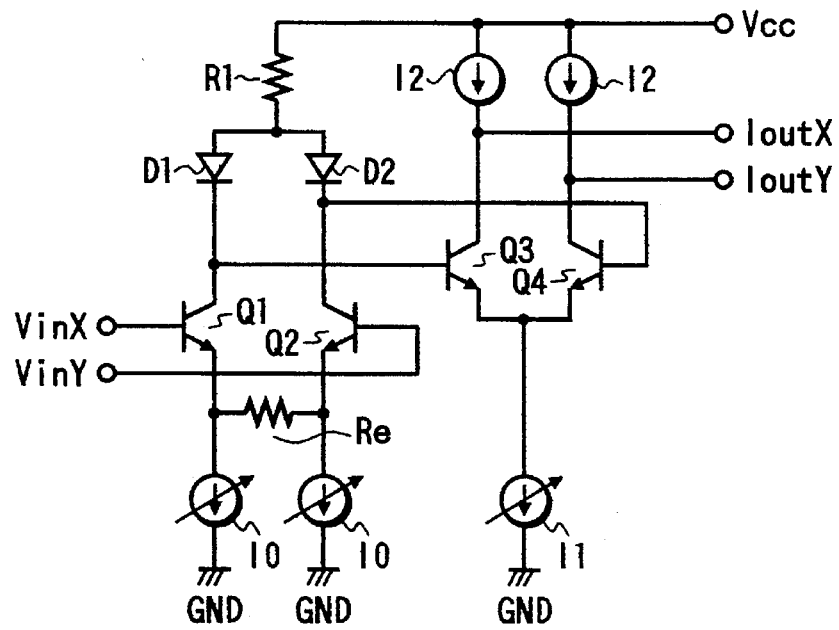
FIG. 3 is a circuit diagram illustrating a differential amplifier practiced as one preferred embodiment of the invention.

Referring to FIG. 3, there is shown a circuit diagram of the differential amplifier constituting the above-mentioned mutual conductance gm practiced as one preferred embodiment of the invention. Input signals VinX and VinY are supplied to a pair of npn-type input bipolar transistors Q1 and Q2 at bases thereof respectively. Variable current sources I0 for setting an input dynamic range are provided between emitters of the transistors Q1, Q2 and circuit ground potentials (0 volt) respectively. An emitter resistor Re is provided between the emitters of the transistors Q1 and Q2. Collectors of the transistors Q1 and Q2 are coupled to cathodes of diodes D1 and D2 respectively, the diodes serving as unidirectional devices. Anodes of the diodes D1 and D2 are commonly connected to be coupled through a load resistor R1 to a circuit power potential Vcc such as 5 volts.

Collector output signals of the transistors Q1 and Q2 are supplied to a pair of npn-type, differentially coupled bipolar transistors Q3 and Q4 at bases thereof. A variable current source I1 for controlling the mutual conductance is provided between a common emitter of the differential transistors Q3 and Q4 and the circuit ground potential GND. A current load I2 whose current is ½ of the variable current source I1 provided on the above-mentioned common emitter is provided on each of collectors of the differential transistors Q3 and Q4. The current source loads I2 and the variable current source I1 are in a relationship of I2=I1½. From the collectors of the differential transistors Q3 and Q4, output current IoutX and IoutY are output. When constituting the above-mentioned first-order low-pass filter, the output currents IoutX and IoutY are supplied to the capacitor of FIG. 2 (C1 or C2) as a charge/discharge current.

The mutual conductance gm of the above-mentioned differential amplifier is obtained from the following equation:

$$gm = dIout/dVin = (1/Re) \times (I1/I0) \qquad (1)$$

Given that the mutual conductance gm of the amplifiers Gm1 through Gm4 be constant, a transfer function of the second-order low-pass filter of FIG. 2 is expressed as follows:

$$H(S) = dVout/Vin = (gm^2/C1C2)/[S^2 + Sgm/C2 + gm^2/C1C2] \qquad (2)$$

On the other hand, the general expression for the second-order low-pass filter is given as equation (3) below:

$$H(S) = \omega^2/[S^2 + S\omega/Q + \omega^2] \qquad (3)$$

From the equations (2) and (3), $\omega = gm/(C1C2)^{1/2+cc}$ and $Q = (C2/C1)^{+c,fra\ 1/2}$]. Since $\omega/2\pi$, the cutoff frequency fc is expressed in the following equation (4):

$$fc = [½\pi(C1C2)^{1/2}] \times (I1/I0) \qquad (4)$$

Conventionally, the seventh-order active filter is constituted in one of the manners in which the current I0 is fixed and the current I1 is variable with the capacitors C1 and C2 fixed and, conversely, the current I0 and the current I1 are fixed with the capacitors C1 and C2 variable. When the signal frequencies handled by the signal-processing semiconductor integrated circuit device 100 of the hard disk HDD extend over a wide range, or when the frequency of a recorded signal widely varies depending on an address of a selected magnetic disk track, it has been found that the current I1 needs to be varied over a relatively wide range. Namely, the manner in which the capacitors C1 and C2 are variable requires to form the capacitance with precision over a relatively wide range, making it very difficult and therefore unrealistic to fabricate the device based on the above-mentioned manner.

An attempt to set the cutoff frequency fc by the current I1 over a relatively wide range, for example, to 27 MHz, 9 times as high as 3 MHz requires to flow a current 9 times as high as when the current I1 is at 3 MHz, resulting in a significant increase in power consumption.

Due to the power consumption and resultant heat generation, a conventional related technique can set the cutoff frequency to a level at most 3 to 5 times as high as a minimum cutoff frequency fcmin that can be set in the active filter using the above-mentioned mutual conductance of the differential amplifier. Hence, the signal-processing semiconductor integrated circuit device 100 needs to replace a filter part for each system used and involves a relatively large power consumption.

The present embodiment is provided with the fc setting register 22 and the fc range register as shown in FIG. 1. The fc range register 23 is based on 8 bits, 4 bits of which are assigned to the setting of the minimum cutoff frequency fcmin and the other 4 bits to the setting of a maximum cutoff frequency fcmax. The fc setting register 22 is also based on 8 bits.

Table 1 below lists a register mapping for specifications with the minimum cutoff frequency fcmin set to a range of 3 MHz to 18 MHz and the maximum cutoff frequency fcmax set to a range of 12 MHz to 27 MHz. The microcomputer 700 (FIG. 7) as the external system controller selects each of combinations of the fcmin values and the fcmax values. For the above-mentioned register mapping of the fc range register 23, the fc setting register 22 (consisting of 8 bits) is constituted as shown in Table 2 below. As seen from Table 2, for register values 00Hex through FFHex (Hex denotes hexadecimal notation), the cutoff frequencies fc to be set range from the fcmin value to the fcmax value, a resolution being determined as (fcmax−fcmin)/255.

TABLE 1

| fcmin settings | | | | | fcmax settings | | | | |
|---|---|---|---|---|---|---|---|---|---|
| a3 | a2 | a1 | a0 | fcmin value | b3 | b2 | b1 | b0 | fcmax value |
| 0 | 0 | 0 | 0 | 3 MHz | 0 | 0 | 0 | 0 | 12 MHz |
| 0 | 0 | 0 | 1 | 4 MHz | 0 | 0 | 0 | 1 | 13 MHz |
| 0 | 0 | 1 | 0 | 5 MHz | 0 | 0 | 1 | 0 | 14 MHz |
| . | . | . | . | . | . | . | . | . | . |
| 1 | 1 | 1 | 1 | 18 MHz | 1 | 1 | 1 | 1 | 27 MHz |

TABLE 2

| fc setting register | | | | | | | | |
|---|---|---|---|---|---|---|---|---|
| c7 | c6 | c5 | c4 | c3 | c2 | c1 | c0 | fc setting |
| 0 | 0 | 0 | 0 | 0 | 0 | 0 | 0 | fcmin value |
| 0 | 0 | 0 | 0 | 0 | 0 | 0 | 1 | fcmin + 1(fcmax − fcmin)/255 |
| 0 | 0 | 0 | 0 | 0 | 0 | 1 | 0 | fcmin + 2(fcmax − fcmin)/255 |
| 0 | 0 | 0 | 0 | 0 | 0 | 1 | 1 | fcmin + 3(fcmax − fcmin)/255 |
| . | . | . | . | . | . | . | . | . |
| 1 | 1 | 1 | 1 | 1 | 1 | 1 | 1 | fcmax value |

The fc range register 23 mentioned above is provided. Since 16 selections are possible, when the fc range register is applied to the signal-processing semiconductor integrated circuit device 100 provided in the above-mentioned hard disk HDD, a sufficient degree of freedom applicable according to the specifications the hard disk may be provided. It should be noted that increasing the number of bits constituting the fc range register 23 and the fc setting register 22 extends the above-mentioned setting range and provides a finer resolution.

Now, turning to the power consumption, it is seen from the equation (4) that, when the current I0 is at a certain level, fc varies linearly according to the current I1. Namely, as mentioned above, when compared with the current I1 with fc=3 MHz, the I1 with fc=27 MHz reaches a value as high as 9 times. For the minimum current levels of the currents I0 and I1, if a circuit of bipolar transistor type or MOSFET (Metal Oxide Semiconductor Field Effect Transistor) type is used, a current of about several tens of μA is required for the circuit to operate with stability. To ensure the linearity of the cutoff frequency fc over a relatively wide range, an additional current of several tens of μA is required. As a result, the entire seventh-order filter circuit requires a current of several tens of mA.

Figure 5:
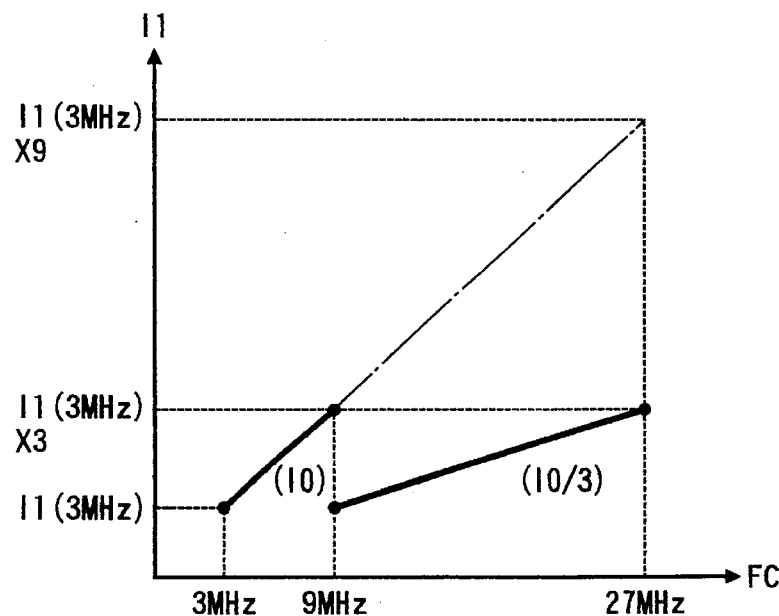
FIG. 5 is a characteristics diagram illustrating the relationship between the constant current I1 and a cutoff frequency (fc)

In the present embodiment, the setting range of the cutoff frequency is divided into two groups of 3 MHz to 9 MHz and 9 MHz to 27 MHz for example as shown in the characteristics diagram of FIG. 5. A reference current source for forming the current I0 in a range 3 times as high as the group of 3 MHz to 9 MHz is indicated as Iref0. In a range 3 times as high as the group of 9 MHz to 27 MHz, the reference current source is reduced to Iref0/3. In this case, since the setting range is only about 3 times as high in each group, the reference current source Iref0 reaches only about several tens of μA, making the current I0 smaller accordingly. Also, the variable current I1 is only about 3 times as high as the level with fc=3 MHz, thereby reducing a total power consumption significantly. Therefore, the present embodiment may be constituted using the conventional active filter as it is.

Figure 4:
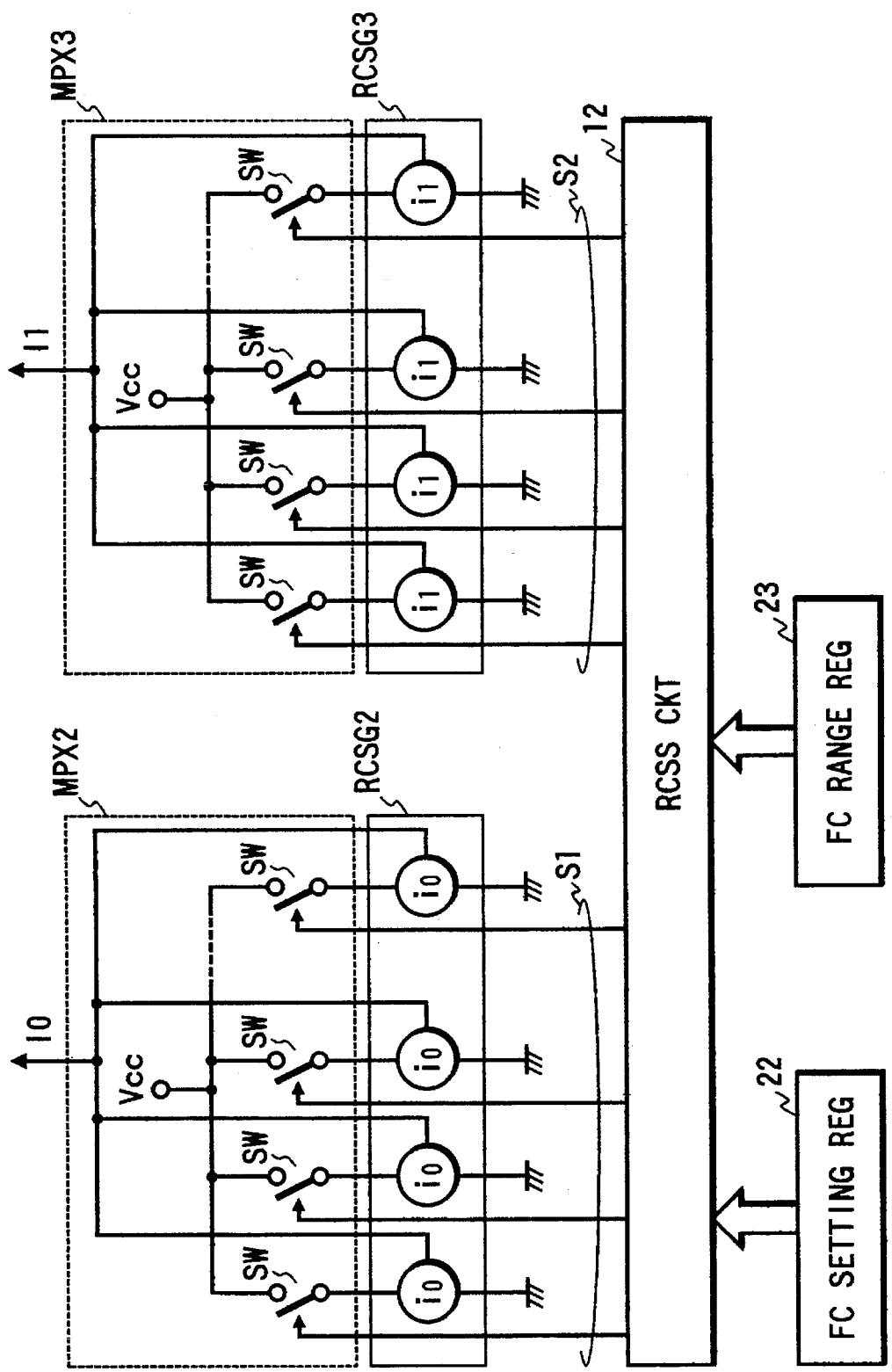
FIG. 4 is a circuit diagram illustrating an current source circuit practiced as one preferred embodiment of the invention, the current source circuit for forming constant currents I0 and I1 for controlling the mutual conductance of the differential amplifier of FIG. 3.

Referring to FIG. 4, there is shown a circuit diagram illustrating the reference current source circuits RCSG2 and RCSG3 for forming the above-mentioned currents I0 and I1, practiced as one preferred embodiment of the invention. In this embodiment, reference current sources i0 and i1 each consisting of plurality of current source loads, supply an operating voltage Vcc through a switching device SW controlled by control signals S1 and S2 formed by decoding the setting values of the fc range register 23 and the fc setting register 22 by the above-mentioned reference current source select logic (RSCC CKT2) 12. This constitution allows only the minimum number of reference current sources necessary to be put in an operating state, thereby reducing the power consumption of the reference current source circuits RCSG2 and RCSG3 too. The embodied circuit of FIG. 4 corresponds to the reference current source circuits RCSG2 and RCSG3, the reference current source select logic RSCC CKT 12, and the multiplexers MPX2 and MPX3 of FIG. 1.

The reference currents i0 and i1 put by the reference current source select logic circuit RSCC CKT2 into the operating state are multiplexed by the multiplexers MPX2 and MPX3 to be supplied to the differential amplifier of FIG. 3 as the variable currents I0 and I1 to set the mutual conductance gm of the differential amplifier. The multiplexers MPX2 and MPX3 are controlled by the control logic RSCC CKT2 for fc setting of FIG. 1.

As with the embodiment of FIG. 4, the plurality of reference current sources i0 for the variable current I0 and the plurality of reference current sources i1 for the current I1 are provided and combinations thereof allow a variety of current value settings, thereby providing the increased degree of freedom of current setting. As a result, the power consumption is reduced while ensuring high performance (high linearity).

Figure 9:
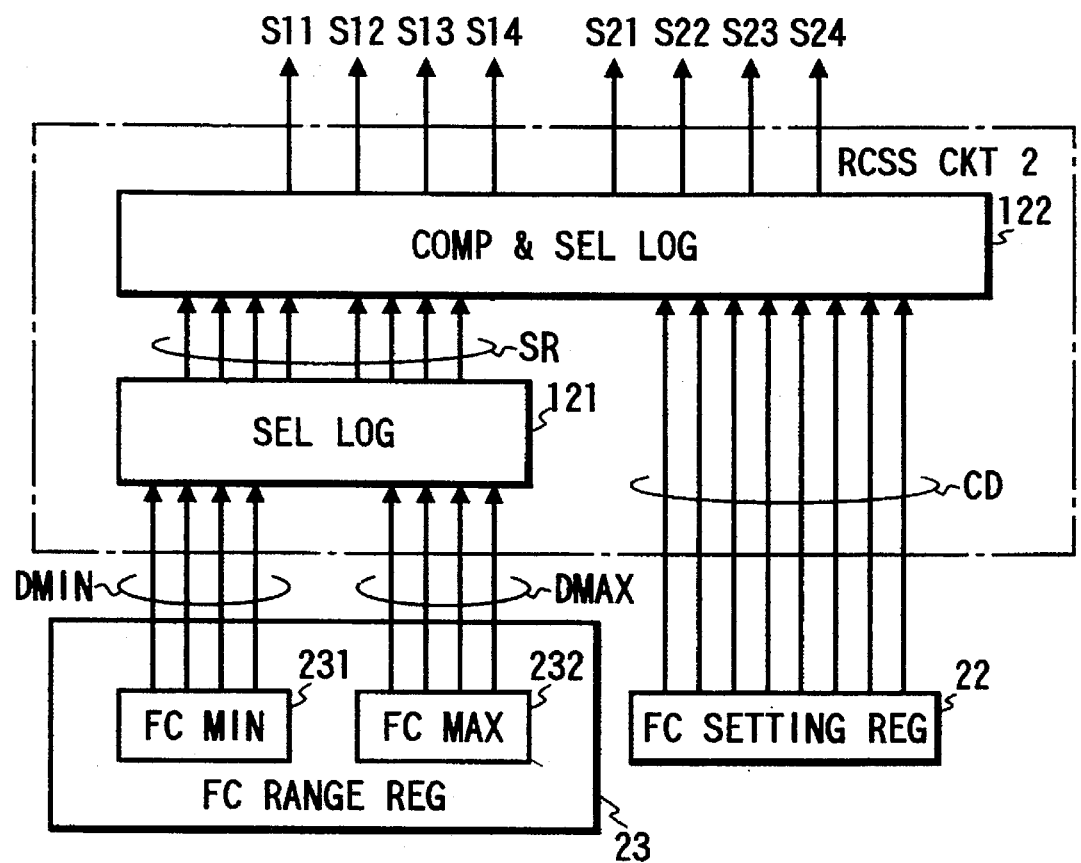
FIG. 9 is a block diagram illustrating a reference current source selector circuit RCSS CKT2.
Figure 10:
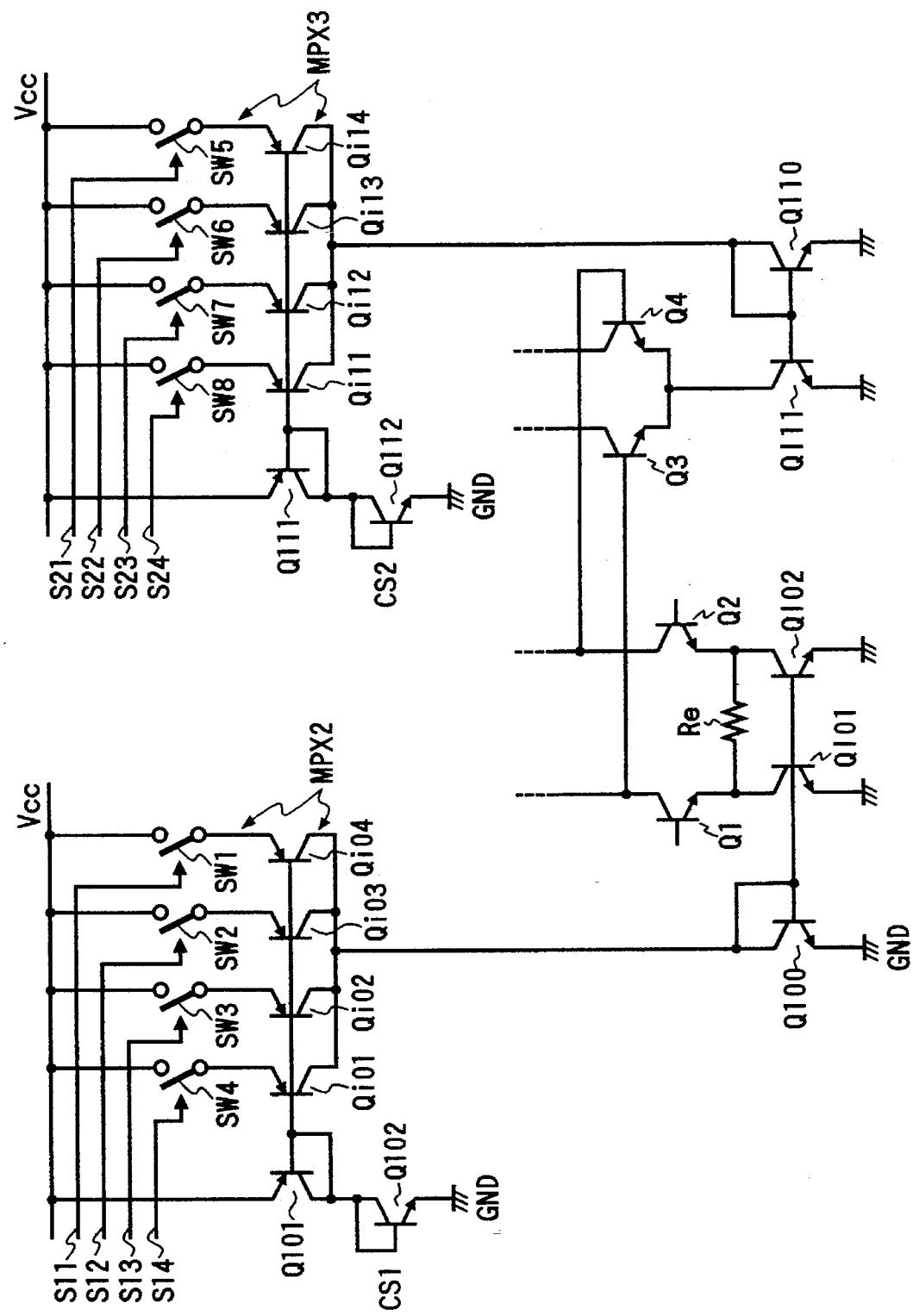
FIG. 10 is a circuit diagram illustrating the connection between reference current sources (RCSG2, RSCG3), multiplexers (MPX2, MPX3), and the active filter.

Referring to FIG. 9, there is shown a circuit block diagram illustrating the above-mentioned reference current source select logic circuit RSCC CKT2 practiced as one preferred embodiment of the invention. The logic circuit RSCC CKT2 receives signals Dmin and Dmax from a fcmin register portion 231 and a fcmax register portion 232 respectively of the fc range register (fc Range REG) 23. The RSCC CKT2 includes a select logic circuit (SEL LOG) 121 for generating a basic select signal SR for selecting a combination of currents I0 and I1 required for a target system from the reference current source circuits RCSG2 and RCSG3 and a compare and select logic circuit 122 that receives the basic select signal SR coming from the select logic circuit 121 and data signal CD coming from the fc setting register 22 and compares these signals to select, based on the comparison result, an optimum combination from the combinations selected by the select logic circuit 121. The compare and select logic circuit 122 supplies a plurality of select signals S11 through S14 and S21 through S24 to the switching devices SW1 through SW4 of the multiplexer MPX2 and the switching devices SW5 through SW8 of the multiplexer MPX3 respectively as shown in FIG. 10. The switching devices SW1 through SW4 are coupled between emitters of reference current source transistors Qi01 through Qi04 each consisting of a pnp-type bipolar transistor and power potential lines over which the circuit power potential Vcc is supplied. Collectors of the reference current source transistors Qi01 through Qi04 are commonly coupled to a collector of a npn-type bipolar transistor Q100 current-mirror coupled with the variable current source I0 (npn-bipolar transistors QI01 and QI02) of the differential amplifier constituting the above-mentioned mutual conductance gm of FIG. 3. Bases of the reference transistors Qi01 through Qi04 are coupled to transistors Q101 and Q102 constituting a first constant current source circuit CS1. The transistor Q101 is current-mirror coupled with the reference current source transistors Qi01 through Qi04 as shown in FIG. 10.

Likewise, the switching devices SW5 through SW8 are coupled between emitters of reference current source transistors Qi11 through Qi14 each consisting of a pnp-type bipolar transistor and power potential lines over which the circuit power potential Vcc is supplied. Collectors of the reference current source transistors Qi11 through Qi14 are commonly coupled to a collector of an npn-type bipolar transistor Q110 current-mirror coupled to the variable current source I1 (npn-type bipolar transistor QI11) of the differential amplifier constituting the mutual conductance gm of FIG. 3. Bases of the reference current source transistors Qi11 through Qi14 are coupled to transistors Q111 and Q112 constituting a second constant current source circuit CS2. The transistor Q111 is current-mirror coupled with the reference current source transistors Qi11 through Qi14 as shown in FIG. 10. This setup allows the provision of a plurality of reference current sources i0 for the variable current I0 and a plurality of reference current sources i1 for the variable current I1, combinations of which allows to set a variety of current values, thereby increasing the degree of freedom of current setting. It should be noted that each current source circuit has four reference current sources in FIG. 10; but the number of reference current sources is not limited thereto.

Figure 6:
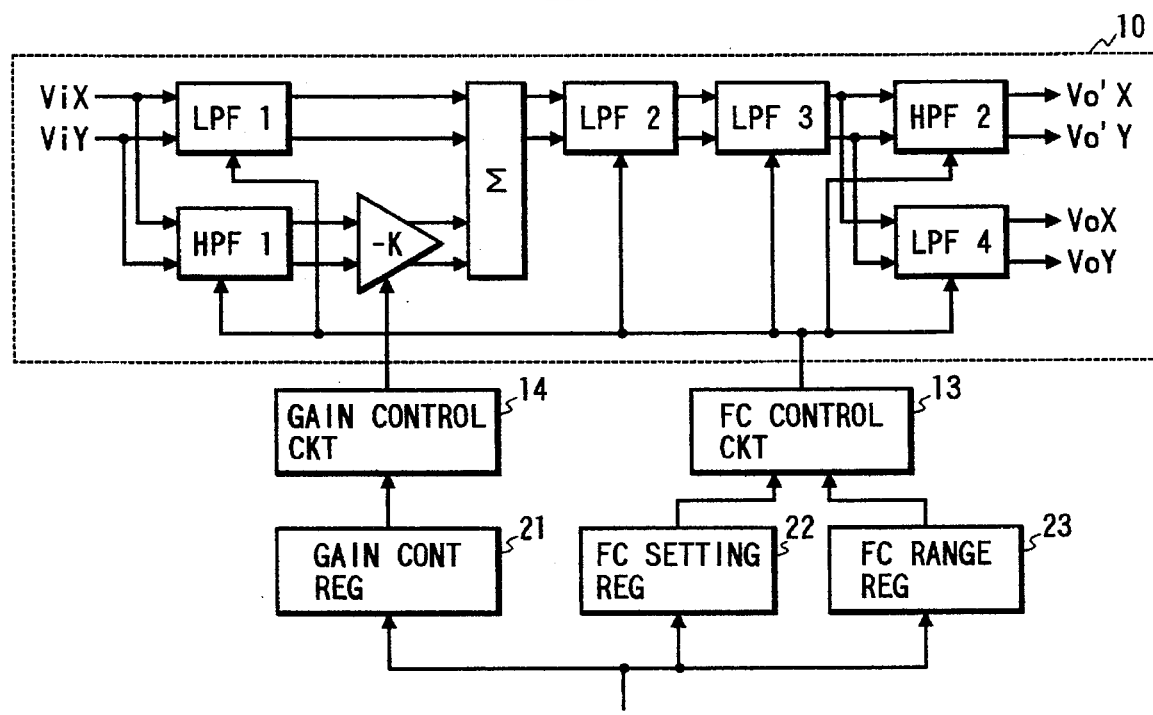
FIG. 6 is a block diagram illustrating one preferred embodiment of an active filter circuit associated with the invention.

Referring to FIG. 6, there is shown a block diagram of the above-mentioned seventh-order active filter practiced as one preferred embodiment of the invention. A core active filter comprises a second-order low-pass filter LPF1, a second-order high-pass filter HPF1, a boost amplifier –K, a synthesizer Σ, another second-order low-pass filter LPF2, still another second-order low-pass filter LPF3, a first-order high-pass filter HPF2, and a first-order low-pass filter LPF4. To control the core active filter, a gain control register 21, the fc range register 23, the fc setting register 22, and an fc control circuit 13 for interpreting values of these registers to set the current I0 and I1 are provided.

A value of the gain control register 21 is supplied to the gain control circuit 14 comprising a plurality of reference current sources RCSG1, the control logic RCSS CKT1, and the multiplexer MPX1. A gain control current IG is supplied to the boost amplifier –K so that an optimum gain may be obtained according to the value of the gain control register 21. In the seventh-order active filter 10 thus constituted, filter differential outputs Vo'X and Vo'Y are output from the last-stage first-order high-pass filter HPF2 and filter outputs signals VoX and VoY are output from the last-stage first-order low-pass filter LPF4.

The above-mentioned embodiments provide the following functions and effects:

(1) A voltage-controlled filter circuit comprising: a variable conductance circuit having: a pair of input transistors supplied with an input voltage signal at bases thereof and a first variable current source at each of emitters thereof; load means commonly coupled to the pair of input transistors at collectors thereof via unidirectional devices; a pair of differential transistors supplied at bases thereof respectively with outputs of the collectors of the pair of input transistors; a second variable current supply coupled to common emitters of the pair of differential transistors; and a current source load coupled respectively to collectors of the pair of differential transistors so that a half of a current value of the second variable current source flows; wherein a current value of the first current source is switched to become smaller as predetermined frequency ranges get higher. As a result, by controlling the mutual conductance of the differential transistor, the setting range in which the variable currents to be set with cutoff frequencies are set may be made relatively small, thereby allowing to set a wide range of cutoff frequencies at a low power consumption.

(2) The above-mentioned first variable current source and the second variable current source each obtain a desired current value by multiplexing a plurality of reference current sources by a multiplexer. As a result, the register value for setting a cutoff frequency may be decoded by a logic circuit, thereby facilitating the setting of a predetermined optimum value.

(3) The cutoff frequency range of the above-mentioned active filter circuit may be set by means of the register value for a cutoff frequency setting range. The current values of the first and second variable current sources are set in a plurality of divisions in a preset frequency range. This setup provides an advantage that the setting of substantially and widely ranging cutoff frequencies may be performed at a relatively low power consumption.

(4) In a signal-processing semiconductor integrated circuit device (or read channel circuit) used in a hard disk memory device that increases the frequency of a recording signal as the relative rotational speed between magnetic disk and track, the frequency being handled by the signal-processing semiconductor integrated circuit device, use of the above-mentioned active filter provides a signal-processing semiconductor integrated circuit device of high generality, thereby enhancing mass producibility and reducing the number of externally attached parts, resulting in a significant cost saving.

(5) The above-mentioned novel setup allows the signal-processing semiconductor circuit device containing the active filter according to the present invention to be sealed with plastic (or resin) because of reduced power consumption, thereby significantly reducing the cost of the integrated circuit device itself.

While the preferred embodiments of the present invention have been described using specific terms, such description is for illustrative purposes only, and it is to be understood that changes and variations may be made without departing from the spirit or scope of the appended claims. For example, if the setting range fcmax is at most 3 times as high as the setting range fcmin, these separate setting ranges need not be provided; rather, a cutoff frequency may be set only by varying the variable current I1. Conversely, if the setting range extends widely, there may be provided three or more setting ranges rather than the above-mentioned two, thereby limiting the variation of the variable current I1 to a relatively small level. Thus, provision of a plurality of setting ranges (fcmin to fcmax) and its number may be set in any combinations as required.

The differential amplifier constituting the active filter according to the present invention may be embodied in a variety of manners based on the differential amplifier of FIG. 3. The variable current may be provided by setting the current value by means of a digital/analog conversion for example, in addition to the multiplexing mentioned above.

The present invention is widely applicable as the active filter for setting a wide range of cutoff frequencies by using the mutual conductance of the differential amplifier.

The present invention provides the following advantages among others:

A voltage-controlled filter circuit comprising: a variable conductance circuit having: a pair of input transistors supplied with an input voltage signal at bases thereof and a first variable current source at each of emitters thereof; load means commonly coupled to the pair of input transistors at collectors thereof via unidirectional devices; a pair of differential transistors supplied at bases thereof respectively with outputs of the collectors of the pair of input transistors; a second variable current supply coupled to common emitters of the pair of differential transistors; and a current source load coupled respectively to collectors of the pair of differential transistors so that a half of a current value of the second variable current source flows; wherein a current value of the first current source is switched to become smaller as predetermined frequency ranges get higher. This setup provides an advantage that, by controlling the mutual conductance of the differential transistor, the setting range in which the variable currents to be set with cutoff frequencies are set may be made relatively small, thereby allowing to set a wide range of cutoff frequencies at a low power consumption.

The above-mentioned first and second variable current sources obtain desired current values by multiplexing a plurality of reference constant current sources by multiplexers. This setup provides an advantage that the register value for setting a cutoff frequency may be decoded by a logic circuit, thereby facilitating the setting of a predetermined optimum value.

The cutoff frequency range of the above-mentioned active filter circuit may be set by means of the register value for a cutoff frequency setting range. The current values of the first and second variable current sources are set in a plurality of divisions in a preset frequency range. This setup provides an advantage that the setting of substantially and widely ranging cutoff frequencies may be performed at a relatively low power consumption.

In a signal-processing semiconductor integrated circuit device (or read channel circuit) used in a hard disk memory device that increases the frequency of a recording signal as the relative rotational speed between magnetic disk and track, the frequency being handled by the signal-processing semiconductor integrated circuit device, use of the above-mentioned active filter provides a signal-processing semiconductor integrated circuit device of high generality. This setup provides an advantage of enhancing mass producibility and reducing the number of externally attached parts, resulting in a significant cost saving.

Figure 13:
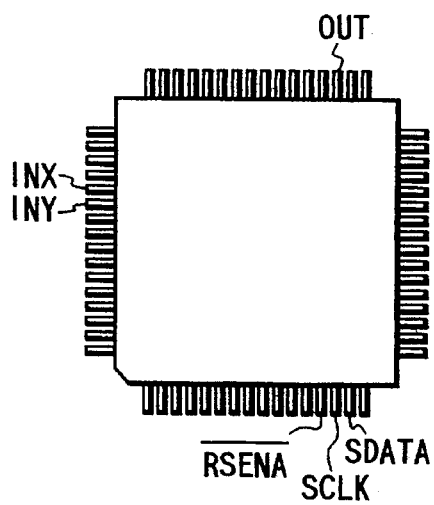
FIG. 13 is a top view of a plastic package of a signal-processing semiconductor integrated circuit device associated with the invention.

The above-mentioned novel setup allows the signal-processing semiconductor circuit device containing the active filter according to the present invention allows to be sealed with plastic (or resin) because of reduced power consumption. This setup provides an advantage of significantly reducing the cost of the integrated circuit device itself. Referring to FIG. 13, there is illustrated a part of the external pins of FIG. 1.

What is claimed is:

1. A voltage-controlled filter circuit comprising:
   a plurality of capacitors;
   a variable conductance circuit including:
      a pair of bipolar junction input transistors whose bases are supplied with input voltage signals;
      a pair of first variable current sources, one first variable current source being electrically connected to the emitter of each bipolar junction input transistor;
      a load resistor commonly coupled to each collector of said pair of bipolar junction input transistors via unidirectional devices;
      a pair of bipolar junction differential transistors whose bases are supplied with outputs of the collectors of said pair of bipolar junction input transistors, respectively, wherein the collectors of the pair of bipolar junction differential transistors are coupled to the plurality of capacitors, respectively;
      a second variable current source commonly coupled to each emitter of said pair of bipolar junction differential transistors; and,
      two current source loads, each current source load being coupled to one of said collectors of said pair of bipolar junction differential transistors, respectively, so that a half of a current value from said second variable current source flows through the pair of bipolar junction differential transistors;
   means for obtaining the current value from said second variable current source and a current value from each of said first variable current sources by multiplexing a plurality of reference current sources in accordance with control signals, in order to set a desired cutoff frequency; and,
   a control circuit including a first register for storing first data associated with a variable range of a frequency of the input voltage signals and a second register for storing second data for specifying the cutoff frequency of the voltage-controlled filter circuit, the control circuit setting a ratio of the two current values of the first and second variable current sources;
   wherein the desired cutoff frequency of the voltage-controlled filter circuit is set by the ratio of the two current values of the first and second variable current sources; and,
   wherein the two current values of the first and second variable current sources are set by the control signals supplied from outside of the voltage-controlled filter circuit.

2. A voltage-controlled filter circuit as defined in claim 1, wherein a cutoff frequency range register value and a cutoff frequency setting register value are decoded by a logic circuit to provide a control signal for controlling the multiplexer for multiplexing said first variable current source and said second variable current source to form the current values thereof.

3. A voltage-controlled filter circuit as defined in claim 2, wherein said voltage-controlled filter circuit is used in a hard disk memory device in which, as a relative rotational speed between a magnetic head and a track increases, a frequency of a recording signal is raised, and wherein said voltage-controlled filter circuit accommodates said recording signal.

4. A semiconductor integrated circuit device for signal processing comprising:
   a first external pin to be supplied with an input signal of which frequency is varied from a predetermined first value to a predetermined second value;

a voltage-controlled filter circuit connected to said first external pin, said voltage-controlled filter circuit including a first current source and a second current source, current values of the first and second current sources being variable, a cutoff frequency of said voltage-controlled filter circuit being variable based on a ratio of the current values of said first current source and said second current source;

a second external pin to be supplied with an output signal of said voltage-controlled filter circuit; and, a control circuit connected to said voltage-controlled filter circuit, said control circuit for controlling the ratio of the current value of said first current source to the current value of said second current source;

wherein the cutoff frequency increases as the ratio of the current values of said first and second current sources increases;

wherein the cutoff frequency decreases as the ratio of the current values of said first and second current sources decreases; and, wherein said control circuit includes a first register for storing first data associated with a variable range of the frequency of said input signal and a second register for storing second data for specifying the cutoff frequency of said voltage-controlled filter circuit, said control circuit setting the ratio of the current value of said first current source to the current value of said second current source.

5. A semiconductor integrated circuit device for signal processing as defined in claim 4, wherein said semiconductor integrated circuit device for signal processing is sealed with resin.

6. A signal reading system comprising:

a disk for storing data on which a data recording density is uniform from a track on the inner periphery of said disk to a track on the outer periphery of said disk;

a motor for rotating said disk at predetermined rotational speed;

a magnetic head for reading the data stored on said disk;

an actuator for positioning said magnetic head to a predetermined track on said disk;

a semiconductor integrated circuit device for receiving a read signal from said magnetic head to perform predetermined signal processing on the received signal; and, a microcomputer for controlling said actuator and said semiconductor integrated circuit device;

said semiconductor integrated circuit device comprising:

a voltage-controlled filter circuit including first and second current sources, both having variable current values, a cutoff frequency of said voltage-controlled filter circuit being made variable by a ratio of a current value of said first current source to a current value of said second current source, said voltage-controlled filter circuit receiving said read signal and removing, from said read signal, a signal component exceeding said cutoff frequency; and, a control circuit connected to said voltage-controlled filter circuit to control the ratio of the current value of said first current source to the current value of said second current source;

wherein the cutoff frequency is higher as the ratio of the current values of said first and second current sources increases;

wherein the cutoff frequency is lower as the ratio of the current values of said first and second current sources decreases; and, wherein said control circuit includes a first register for storing first data associated with a variable range of the frequency of said read signal and a second register for storing second data for specifying the cutoff frequency of said voltage-controlled filter circuit, said control circuit setting the ratio of the current value of said first current source to the current value of said second current source based on said first data and said second data.

7. A signal reading system as defined in claim 6, wherein said first register and said second register are written with said first data and said second data respectively by said microprocessor.

8. A signal reading system as defined in claim 7, wherein said first data is written to said first register when said signal reading system is activated and said microcomputer writes said second data to said second register according to a track address of a track to be read on said disk.

* * * * *